United States Patent
Brady et al.

(10) Patent No.: US 7,915,067 B2
(45) Date of Patent: Mar. 29, 2011

(54) BACKSIDE ILLUMINATED IMAGE SENSOR WITH REDUCED DARK CURRENT

(75) Inventors: Frederick T. Brady, Rochester, NY (US); John P. McCarten, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 50 days.

(21) Appl. No.: 12/169,723

(22) Filed: Jul. 9, 2008

(65) Prior Publication Data

US 2010/0006970 A1    Jan. 14, 2010

(51) Int. Cl.
*H01L 21/383* (2006.01)

(52) U.S. Cl. ............ 438/60; 438/66; 438/67; 438/75; 438/401; 257/E21.617

(58) Field of Classification Search ........... 438/60, 438/66, 67, 75, 401; 257/E21.617
See application file for complete search history.

(56) References Cited

U.S. PATENT DOCUMENTS

| 5,227,313 | A | 7/1993 | Gluck et al. |
| 5,244,817 | A | 9/1993 | Hawkins et al. |
| 5,969,368 | A | 10/1999 | Thompson et al. |
| 6,168,965 | B1 | 1/2001 | Malinovich et al. |
| 6,429,036 | B1 | 8/2002 | Nixon et al. |
| 7,315,014 | B2 | 1/2008 | Lee et al. |
| 2004/0007722 | A1* | 1/2004 | Narui et al. ............ 257/228 |
| 2006/0068586 | A1 | 3/2006 | Pain |
| 2006/0186560 | A1 | 8/2006 | Swain et al. |
| 2007/0194397 | A1 | 8/2007 | Adkisson et al. |
| 2007/0235829 | A1 | 10/2007 | Levine et al. |
| 2009/0206377 | A1* | 8/2009 | Swain et al. ............ 257/292 |

FOREIGN PATENT DOCUMENTS

| EP | 1 612 863 A2 | 1/2006 |
| WO | 2007/030226 | 3/2007 |
| WO | WO 2008/118525 A1 | 10/2008 |

OTHER PUBLICATIONS

T. Joy et al., "Development of a Production-Ready, Back-Illuminated CMOS Image Sensor with Small Pixels," IEEE IEDM, Dec. 2007, pp. 1007-1010.

* cited by examiner

*Primary Examiner* — Kiesha R Bryant
*Assistant Examiner* — Minchul Yang
(74) *Attorney, Agent, or Firm* — Nancy R. Simon

(57) ABSTRACT

A backside illuminated image sensor comprises a sensor layer implementing a plurality of photosensitive elements of a pixel array, and an oxide layer adjacent a backside surface of the sensor layer. The sensor layer comprises a seed layer and an epitaxial layer formed over the seed layer, with the seed layer having a cross-sectional doping profile in which a designated dopant is substantially confined to a pixel array area of the sensor layer. The doping profile advantageously reduces dark current generated at an interface between the sensor layer and the oxide layer. The image sensor may be implemented in a digital camera or other type of digital imaging device.

11 Claims, 4 Drawing Sheets

BACKSIDE ILLUMINATED IMAGE SENSOR WITH REDUCED DARK CURRENT

CROSS REFERENCE TO RELATED APPLICATIONS

The present invention is related to the inventions described in commonly-assigned U.S. patent applications Ser. No. 12/169,709, entitled "Color Filter Array Alignment Mark Formation in Backside Illuminated Image Sensors," Ser. No. 12/169,791, entitled "Wafer Level Processing for Backside Illuminated Image Sensors," and Ser. No. 12/169,810, entitled "Backside Illuminated Image Sensor with Shallow Backside Trench for Photodiode Isolation," which are concurrently filed herewith. The disclosures of these related applications are incorporated by reference herein in their entirety.

FIELD OF THE INVENTION

The present invention relates generally to electronic image sensors for use in digital cameras and other types of imaging devices, and more particularly to processing techniques for use in forming backside illuminated image sensors.

BACKGROUND OF THE INVENTION

A typical electronic image sensor comprises a number of light sensitive picture elements ("pixels") arranged in a two-dimensional array. Such an image sensor may be configured to produce a color image by forming an appropriate color filter array (CFA) over the pixels. Examples of image sensors of this type are disclosed in U.S. Patent Application Publication No. 2007/0024931, entitled "Image Sensor with Improved Light Sensitivity," which is incorporated by reference herein.

As is well known, an image sensor may be implemented using complementary metal-oxide-semiconductor (CMOS) circuitry. In such an arrangement, each pixel typically comprises a photodiode and other circuitry elements that are formed in a silicon sensor layer on a silicon substrate. One or more dielectric layers are usually formed above the silicon sensor layer and may incorporate additional circuitry elements as well as multiple levels of metallization used to form interconnects. The side of the image sensor on which the dielectric layers and associated levels of metallization are formed is commonly referred to as the frontside, while the side having the silicon substrate is referred to as the backside.

In a frontside illuminated image sensor, light from a subject scene is incident on the frontside of the image sensor, and the silicon substrate is relatively thick. However, the presence of metallization level interconnects and various other features associated with the dielectric layers on the frontside of the image sensor can adversely impact the fill factor and quantum efficiency of the image sensor.

A backside illuminated image sensor addresses the fill factor and quantum efficiency issues associated with the frontside dielectric layers by thinning or removing the thick silicon substrate and arranging the image sensor such that light from a subject scene is incident on the backside of the image sensor. Thus, the incident light is no longer impacted by metallization level interconnects and other features of the dielectric layers, and fill factor and quantum efficiency are improved.

Backside illuminated image sensors can be difficult to process due to the thinning or removal of the silicon substrate. Conventional processing techniques, such as those disclosed in, for example, U.S. Patent Application Publication No. 2007/0194397, entitled "Photo-Sensor and Pixel Array with Backside Illumination and Method of Forming the Photo-Sensor," can lead to increased die size or higher cost.

Another problem that arises in backside illuminated image sensors relates to so-called "dark" current, that is, current that is generated in the sensor even in the complete absence of incident light. Dark current adversely impacts sensor performance by making it more difficult to detect incident light. Such current can be particularly problematic in backside illuminated image sensors that are formed utilizing a silicon-on-insulator (SOI) image sensor wafer, as dark current tends to be generated at an interface between a sensor layer and a buried oxide layer. See, for example, T. Joy et al., "Development of a Production-Ready, Back-Illuminated CMOS Image Sensor with Small Pixels," 2007 IEDM Technical Digest, pp. 1007-1009.

Accordingly, a need exists for processing techniques for forming backside illuminated image sensors with reduced dark current, particularly when using SOI image sensor wafers.

SUMMARY OF THE INVENTION

Illustrative embodiments of the invention provide backside illuminated image sensors having reduced dark current.

In accordance with one aspect of the invention, a process of forming a backside illuminated image sensor is provided. The process is a wafer level process for forming a plurality of image sensors each having a pixel array configured for backside illumination, with the image sensors being formed utilizing an image sensor wafer. The image sensor wafer comprises a substrate, a buried oxide layer formed over the substrate, and a seed layer formed over the buried oxide layer. The process includes the steps of forming a sacrificial oxide layer over the seed layer; exposing pixel array areas of the image sensor wafer; implanting a dopant into the seed layer in the exposed pixel array areas; removing the sacrificial oxide layer; forming an epitaxial layer over the doped seed layer; and further processing the image sensor wafer to form the plurality of image sensors.

The pixel array areas of the image sensor wafer may be exposed by, for example, depositing a photoresist over the sacrificial oxide layer, and patterning the photoresist to expose the pixel array areas of the image sensor wafer. Remaining portions of the photoresist are removed subsequent to the implanting of the dopant into the seed layer.

The dopant may be implanted into the seed layer in the exposed pixel array areas, for example, by implanting the dopant through the sacrificial oxide layer and into the seed layer in the exposed pixel array areas. As another example, the dopant may be implanted into the seed layer in the exposed pixel array areas by etching openings in the sacrificial oxide layer in respective ones of the exposed pixel array areas and implanting the dopant through the etched openings into the seed layer.

In accordance with another aspect of the invention, a backside illuminated image sensor comprises a sensor layer implementing a plurality of photosensitive elements of a pixel array, and an oxide layer adjacent a backside surface of the sensor layer. The sensor layer comprises a seed layer and an epitaxial layer formed over the seed layer, with the seed layer having a cross-sectional doping profile in which a designated dopant is substantially confined to a pixel array area of the sensor layer.

A backside illuminated image sensor in accordance with the invention may be advantageously implemented in a digital camera or other type of imaging device, and provides improved performance in such a device without significantly increasing image sensor die size or cost.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

The present invention will be illustrated herein in conjunction with particular embodiments of digital cameras, backside illuminated image sensors, and processing techniques for forming such image sensors. It should be understood, however, that these illustrative arrangements are presented by way of example only, and should not be viewed as limiting the scope of the invention in any way. Those skilled in the art will recognize that the disclosed arrangements can be adapted in a straightforward manner for use with a wide variety of other types of imaging devices and image sensors.

Figure 1:
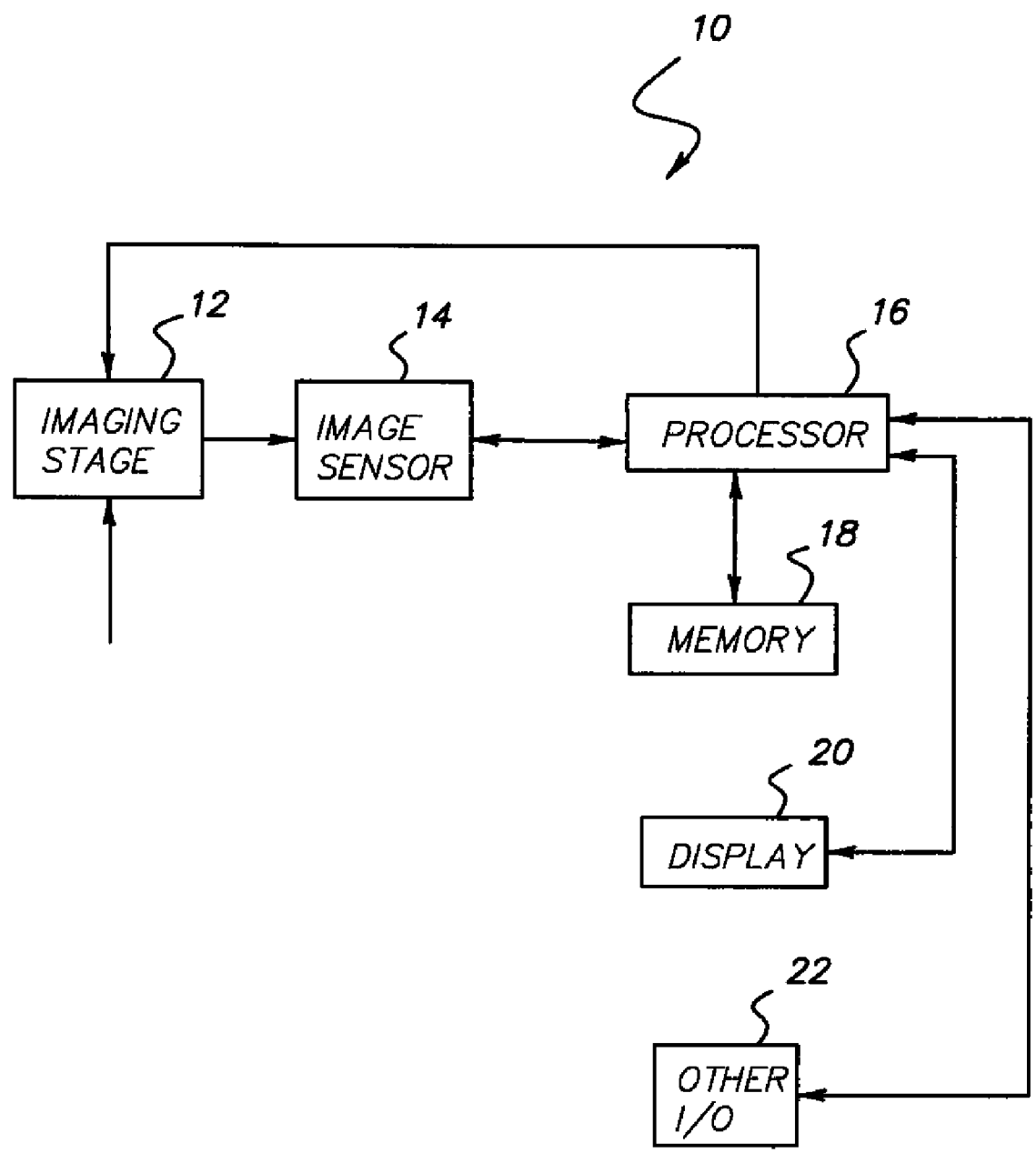
FIG. 1 is a block diagram of a digital camera having a backside illuminated image sensor configured in accordance with an illustrative embodiment of the invention.

FIG. 1 shows a digital camera 10 in an illustrative embodiment of the invention. In the digital camera, light from a subject scene is input to an imaging stage 12. The imaging stage may comprise conventional elements such as a lens, a neutral density filter, an iris and a shutter. The light is focused by the imaging stage 12 to form an image on an image sensor 14, which converts the incident light to electrical signals. The digital camera 10 further includes a processor 16, a memory 18, a display 20, and one or more additional input/output (I/O) elements 22.

Although shown as separate elements in the embodiment of FIG. 1, the imaging stage 12 may be integrated with the image sensor 14, and possibly one or more additional elements of the digital camera 10, to form a compact camera module.

The image sensor 14 is assumed in the present embodiment to be a CMOS image sensor, although other types of image sensors may be used in implementing the invention. More particularly, the image sensor 14 comprises a backside illuminated image sensor that is formed in a manner to be described below in conjunction with FIG. 3. The image sensor generally comprises a pixel array having a plurality of pixels arranged in rows and columns and may include additional circuitry associated with sampling and readout of the pixel array, such as signal generation circuitry, signal processing circuitry, row and column selection circuitry, etc. This sampling and readout circuitry may comprise, for example, an analog signal processor for processing analog signals read out from the pixel array and an analog-to-digital converter for converting such signals to a digital form. These and other types of circuitry suitable for use in the digital camera 10 are well known to those skilled in the art and will therefore not be described in detail herein. Portions of the sampling and readout circuitry may be arranged external to the image sensor, or formed integrally with the pixel array, for example, on a common integrated circuit with photodiodes and other elements of the pixel array.

The image sensor 14 will typically be implemented as a color image sensor having an associated CFA pattern. Examples of CFA patterns that may be used with the image sensor 14 include those described in the above-cited U.S. Patent Application Publication No. 2007/0024931, although other CFA patterns may be used in other embodiments of the invention. As another example, a conventional Bayer pattern may be used, as disclosed in U.S. Pat. No. 3,971,065, entitled "Color Imaging Array," which is incorporated by reference herein.

The processor 16 may comprise, for example, a microprocessor, a central processing unit (CPU), an application-specific integrated circuit (ASIC), a digital signal processor (DSP), or other processing device, or combinations of multiple such devices. Various elements of the imaging stage 12 and the image sensor 14 may be controlled by timing signals or other signals supplied from the processor 16.

The memory 18 may comprise any type of memory, such as, for example, random access memory (RAM), read-only memory (ROM), Flash memory, disk-based memory, removable memory, or other types of storage elements, in any combination.

Functionality associated with sampling and readout of the pixel array and the processing of corresponding image data may be implemented at least in part in the form of software that is stored in memory 18 and executed by processor 16.

A given image captured by the image sensor 14 may be stored by the processor 16 in memory 18 and presented on display 20. The display 20 is typically an active matrix color liquid crystal display (LCD), although other types of displays may be used. The additional I/O elements 22 may comprise, for example, various on-screen controls, buttons or other user interfaces, network interfaces, memory card interfaces, etc.

Additional details regarding the operation of a digital camera of the type shown in FIG. 1 can be found, for example, in the above-cited U.S. Patent Application Publication No. 2007/0024931.

It is to be appreciated that the digital camera as shown in FIG. 1 may comprise additional or alternative elements of a type known to those skilled in the art. Elements not specifically shown or described herein may be selected from those known in the art. As noted previously, the present invention may be implemented in a wide variety of other types of digital cameras or imaging devices. Also, as mentioned above, certain aspects of the embodiments described herein may be implemented at least in part in the form of software executed by one or more processing elements of an imaging device. Such software can be implemented in a straightforward manner given the teachings provided herein, as will be appreciated by those skilled in the art.

The image sensor 14 may be fabricated on a silicon substrate or other type of substrate. In a typical CMOS image sensor, each pixel of the pixel array includes a photodiode and associated circuitry for measuring the light level at that pixel. Such circuitry may comprise, for example, transfer gates, reset transistors, select transistors, output transistors, and other elements, configured in a well-known conventional manner.

As indicated previously, a problem that arises in backside illuminated image sensors formed from SOI image sensor wafers relates to dark current that tends to be generated at an interface between a sensor layer and a buried oxide layer. Techniques for addressing this problem will now be described with reference to FIGS. 2 and 3. It should be noted that the cross-sectional views shown in these figures are simplified in order to clearly illustrate various aspects of the present invention, and are not necessarily drawn to scale. A given embodiment may include a variety of other features or elements that are not explicitly illustrated but would be familiar to one skilled in the art as being commonly associated with image sensors of the general type described.

Figure 2:
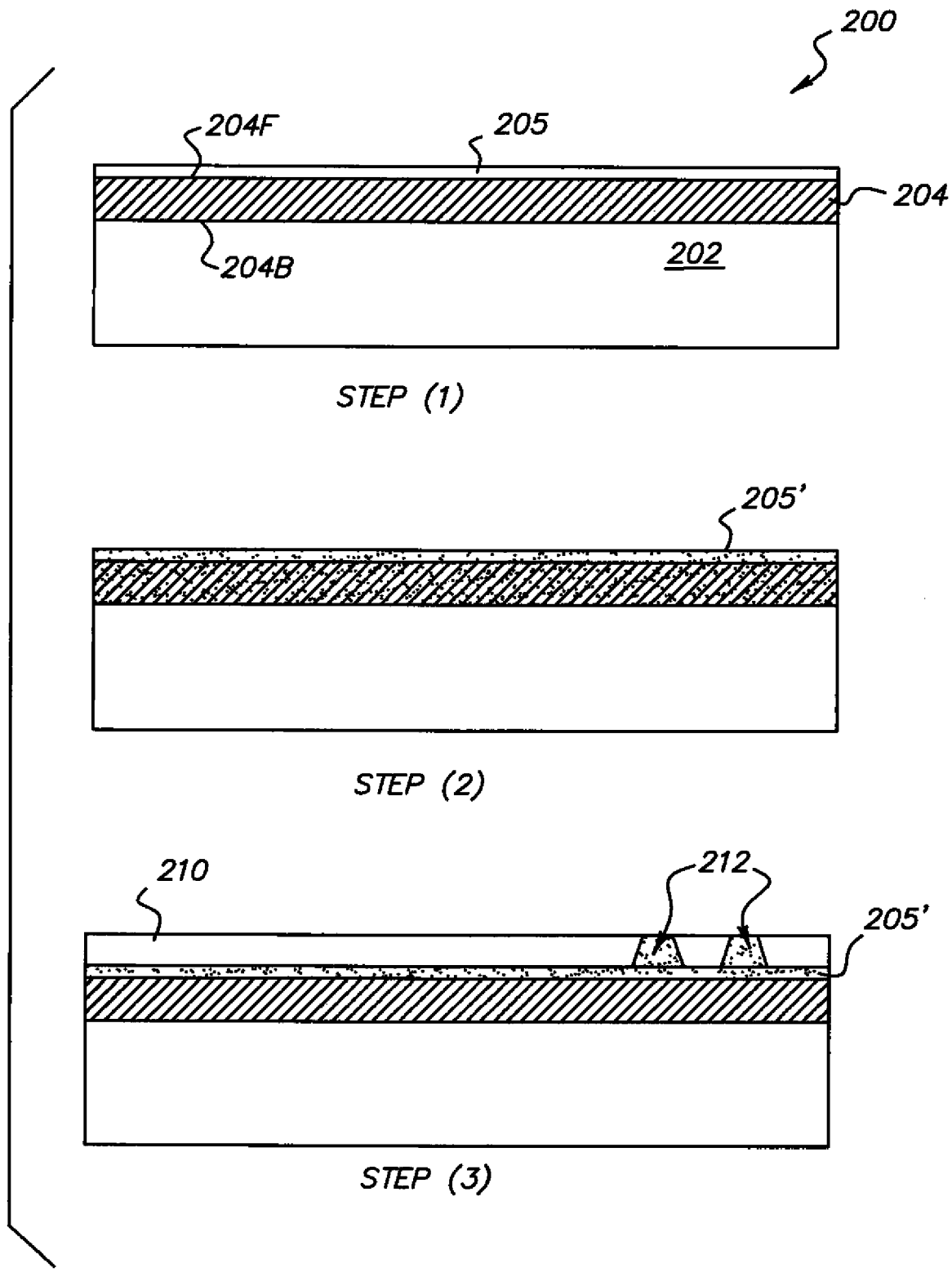
FIG. 2 shows cross-sectional views of portions of a backside illuminated image sensor at various steps in an exemplary process for forming such an image sensor, illustrating a technique for forming a doped silicon seed layer.
Figure 3:
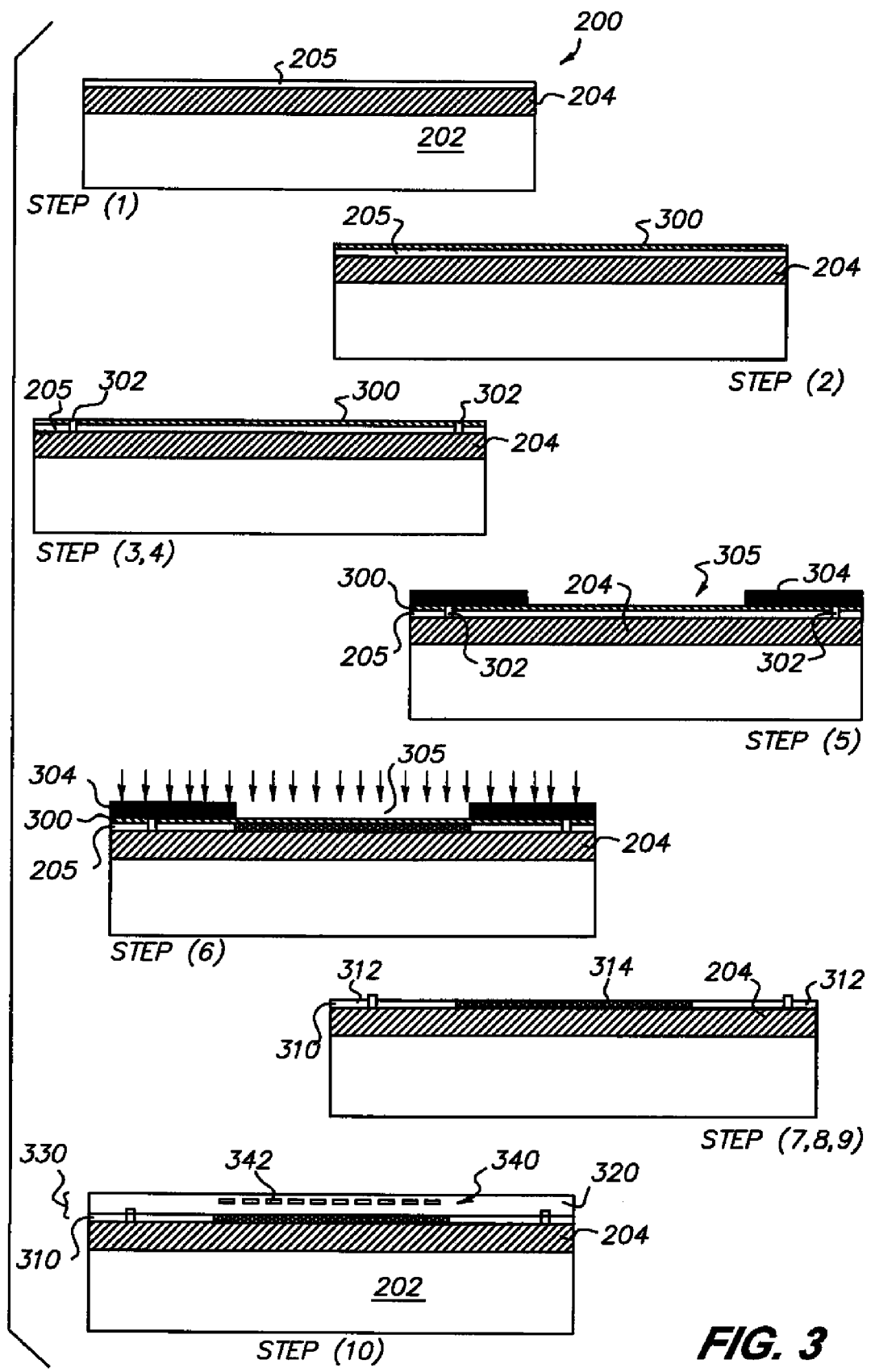
FIG. 3 shows cross-sectional views of portions of a backside illuminated image sensor at various steps in an exemplary process for forming such an image sensor, in accordance with an illustrative embodiment of the invention.

The techniques illustrated in FIGS. 2 and 3 generally involve processing an image sensor wafer to form a plurality of image sensors each having a pixel array configured for backside illumination. The portion of the image sensor wafer 200 as shown in FIGS. 2 and 3 generally corresponds to a particular one of the image sensors, and may be viewed as including a pixel array area surrounded by periphery areas. The periphery areas may include or be associated with bond pad areas, or other portions of the image sensor. A separate pixel array area will generally be associated with each of the image sensors formed using the image sensor wafer.

The image sensor wafer 200 also has a frontside and a backside. As described previously herein, the frontside refers generally to the side of an image sensor on which dielectric layers and associated levels of metallization are formed, while the side having the silicon substrate is referred to as the backside. The terms "frontside" and "backside" will be used herein to denote particular sides of an image sensor wafer or an image sensor formed from such a wafer, as well as sides of particular layers of the image sensor wafer or corresponding image sensor.

As mentioned above, the illustrative embodiments relate to backside illuminated image sensors, that is, image sensors in which light from a subject scene is incident on the photodiodes or other photosensitive elements of the pixel array from a backside of the sensor.

It should be noted that terms such as "on" or "over" when used in conjunction with layers of an image sensor wafer or corresponding image sensor are intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

The image sensor wafer 200 shown in FIGS. 2 and 3 is an example of a silicon-on-insulator (SOI) wafer. Alternative embodiments of the invention may utilize other types of wafers to form backside illuminated image sensors, such as, for example, epitaxial wafers or bulk semiconductor wafers that do not include a buried oxide layer, although an SOI wafer generally provides a smoother surface for backside processing.

FIG. 2 shows one possible wafer level process for forming a doped silicon seed layer on a frontside surface of a buried oxide layer of the image sensor wafer 200. The process includes steps denoted (1), (2) and (3).

Step (1) shows a starting SOI image sensor wafer 200 comprising a silicon substrate 202, a buried oxide (BOX) layer 204 formed on the substrate, and a silicon seed layer 205 formed on the buried oxide layer. As indicated above, various layers of the image sensor wafer may be described herein as having frontside and backside surfaces. For example, the buried oxide layer 204 has a frontside surface 204F and a backside surface 204B.

In step (2), in-situ doping of the silicon seed layer 205 is performed to form an N+ silicon seed layer 205' as shown. An N+ silicon seed layer is used if the pixel array is based on p-type metal-oxide-semiconductor (PMOS) circuitry, while a P+ silicon seed layer would be used if the pixel array is based on n-type metal-oxide-semiconductor (NMOS) circuitry. For this example, PMOS circuitry is assumed, and thus the doped silicon seed layer is an N+ silicon seed layer as mentioned previously.

In step (3), a silicon epitaxial layer 210 is grown over the N+ silicon seed layer 205' and a number of wells 212 are formed in the silicon epitaxial layer. The wells 212 are generally formed in a portion of the image sensor wafer corresponding to a periphery area of a given image sensor, rather than in a pixel array area of the sensor.

The process illustrated in FIG. 2 can provide a reduction in dark current at the interface between a sensor layer and a buried oxide layer in a backside illuminated image sensor. However, we have discovered that this particular technique may result in the shorting of the peripheral wells 212 to the N+ silicon seed layer 205' and to each other, as is illustrated in step (3) of the figure. Although such shorting of peripheral wells can be prevented by increasing the thickness of the silicon epitaxial layer 210, this can undesirably increase the crosstalk between adjacent photodiodes of the pixel array to be formed in the epitaxial layer 210.

FIG. 3 shows a wafer level process for forming a backside illuminated image sensor that reduces dark current, but also avoids shorting of peripheral wells without substantially increasing epitaxial layer thickness. The process includes steps denoted (1) through (10).

It should be noted that the image sensor formation process to be described will focus on the formation of a doped silicon seed layer on an image sensor wafer. Other aspects of image sensor formation, such as the formation of photodiodes and associated circuitry of the pixel array in a sensor layer of the image sensor wafer, and the formation of additional features, such as circuitry, conductors, bond pads and so on, may be implemented using conventional techniques that are familiar to one skilled in the art.

Step (1) again shows starting SOI image sensor wafer 200 comprising silicon substrate 202, buried oxide layer 204 formed on the substrate, and silicon seed layer 205 formed on the buried oxide layer. The silicon seed layer in this embodiment may have a thickness of about 50 Angstroms to about 0.2 micrometers (μm).

In step (2), a sacrificial oxide layer 300 is formed over the silicon seed layer 205. The sacrificial oxide layer in this embodiment may have a thickness of about 50 Angstroms to about 200 Angstroms.

In step (3), alignment marks 302 are patterned and formed, which will generally involve lithography operations such as photoresist deposition followed by exposing, developing and etching. The alignment marks are patterned in accordance with a desired alignment mark pattern, which will generally depend upon the particular type of lithography equipment being used to process the image sensor wafer. In this example, the alignment marks 302 extend through the sacrificial oxide layer 300 and the seed layer 20S, to an underlying frontside surface of the buried oxide layer 204.

The alignment marks may comprise polysilicon. Advantageous techniques for forming polysilicon alignment marks of this type in a backside illuminated image sensor are disclosed in the above-cited U.S. patent application Ser. No. 12/169, 709. In one embodiment disclosed therein, alignment mark openings are etched to expose an underlying frontside surface of a buried oxide layer, and polysilicon alignment marks are formed by epitaxial growth on the exposed surface of the buried oxide layer through the openings.

In step (4), any remaining photoresist from the patterning of the alignment marks 302 is stripped from the sacrificial oxide layer 300.

In step (5), a photoresist 304 is deposited over the sacrificial oxide layer 300 and patterned in alignment with the alignment marks 302 to expose a pixel array area 305. The pixel array area 305 is associated with a given image sensor to be formed from the image sensor wafer, while periphery areas of the given image sensor remain unexposed and covered by the photoresist. Alternative embodiments may utilize techniques other than deposition and patterning of photoresist to expose pixel array areas of the image sensor wafer.

In step (6), a dopant is implanted into the seed layer 205 in the exposed pixel array area 305. The dopant in this example is an n-type dopant, namely arsenic, although other n-type dopants, such as phosphorus, may be used in other embodiments. As indicated above, an n-type dopant is used for a pixel array that is based on PMOS circuitry, while a p-type dopant would be used for a pixel array based on NMOS circuitry. Exemplary p-type dopants include boron and indium. Again, PMOS circuitry is assumed for this example, and thus the dopant is an n-type dopant. The dopant concentration for the seed layer implant may be greater than or equal to about $5 \times 10^{14}$ atoms/cm$^3$, although other dopant concentrations may be used in other embodiments.

In the arrangement illustrated in the figure, step (6) involves implanting the dopant through the sacrificial oxide layer 300 and into the seed layer 205 in the exposed pixel array area 305. Other embodiments may involve, for example, etching an opening in the sacrificial oxide layer in the exposed pixel array area and implanting the dopant through the etched opening into the seed layer. The latter etched opening approach may be used to provide a greater implant depth than that which can be achieved by implanting through the sacrificial oxide layer. The silicon seed layer 205 after completion of the doping operation will be denoted herein as doped silicon seed layer 310.

In step (7), any remaining portions of the photoresist 304 are stripped from the sacrificial oxide layer 300.

In step (8), the upper surface of the wafer is cleaned, and then annealed to repair any damage.

In step (9), the sacrificial oxide layer 300 is removed.

It can be seen from the figure that the doped silicon seed layer 310 at the completion of these steps has a cross-sectional doping profile in which the n-type dopant, arsenic in this example, is substantially confined to the pixel array area 305. Thus, the doped silicon seed layer 310 comprises undoped portions 312 in the periphery areas of the given image sensor and an N+ doped portion 314 in the pixel array area of the given image sensor. This backside doping profile serves to reduce the dark current at the interface with the buried oxide layer 204, while avoiding peripheral well shorting of the type previously described in conjunction with FIG. 2.

In step (10), a silicon epitaxial layer 320 is grown over the doped silicon seed layer 310 that includes undoped portions 312 and N+ doped portion 314. The resulting image sensor wafer includes a sensor layer 330 comprising the doped silicon seed layer 310 and the silicon epitaxial layer 320. The epitaxial layer may be grown to a thickness of about 1 µm to 20 µm.

Subsequent processing operations may involve, for example, forming portions of a pixel array 340 comprising photodiodes or other photosensitive elements 342 in the epitaxial layer 320. Such elements are formed in direct or indirect alignment with the alignment marks 302.

Although not shown in the figure, further processing operations are applied to the image sensor wafer to produce a plurality of backside illuminated image sensors including the image sensor 14 of digital camera 10. By way of illustrative example, these additional operations may include forming at least one dielectric layer on a frontside surface of the epitaxial layer 320. The dielectric layer in this embodiment may comprise multiple layers of dielectric material and may include, for example, an interlayer dielectric (ILD) and an intermetal dielectric (IMD) that separates multiple levels of metallization. Various image sensor features such as interconnects, gates or other circuitry elements may be formed within the dielectric layer using conventional techniques. Other embodiments may comprise multiple dielectric layers, possibly separated from one another by one or more intervening layers. The dielectric layers and other layers formed in the further processing operations are also aligned either directly or indirectly to the alignment marks 302.

After formation of the dielectric layer, a handle wafer is attached to a frontside surface of the dielectric layer. The handle wafer may be attached using, for example, low temperature oxide-to-oxide bonding.

The substrate 202 is then removed to expose a backside surface of the buried oxide layer 204. The substrate may be removed using, for example, grinding, polishing or etching techniques, in any combination. Typically, the substrate is removed in its entirety, exposing the buried oxide layer 204 at the backside of the wafer. In an alternative embodiment, such as one involving an epitaxial or bulk semiconductor wafer, the substrate may be thinned rather than completely removed.

Following removal of the substrate, the structure is flipped over and CFAs and associated microlenses are formed in a CFA layer on the backside surface of the buried oxide layer 204. The handle wafer serves as a substrate, providing support for the structure after the removal of the original substrate 202. Generally, each of the pixel arrays of the image sensor wafer has a corresponding CFA which includes color filter elements that are arranged over respective photosensitive elements 342 of the sensor layer 330.

The resulting processed image sensor wafer is then diced into a plurality of image sensors configured for backside illumination, one of which is the image sensor 14 in digital camera 10. The wafer dicing operation will be described in greater detail below in conjunction with FIG. 4. The handle wafer in this embodiment is not removed prior to dicing, but instead serves as a permanent handle wafer, portions of which remain part of respective ones of the image sensors that are separated from one another in the dicing operation.

In an alternative embodiment, a temporary carrier wafer may be used in place of the handle wafer. The temporary carrier wafer may be attached using epoxy or another suitable adhesive. After attachment of the temporary carrier wafer, the substrate 202 is removed as described above. A transparent cover sheet comprising transparent covers overlying respective ones of the CFAs may then be attached to the backside surface of the image sensor wafer prior to removing the temporary carrier wafer. Each such glass cover may comprise a central cavity arranged over its corresponding CEA and further comprise peripheral supports secured to the backside surface of the oxide layer 204 via epoxy. The transparent cover sheet may be formed of glass or another transparent material. Such a cover sheet may be attached to the wafer as a single sheet which is divided into separate covers when the image sensors are diced from the wafer. Further details regarding the use of a temporary carrier wafer and transparent cover sheet may be found in the above-cited U.S. patent application Ser. No. 12/169,791. However, it is to be appreciated that use of such elements and associated processing operations is not a requirement of the present invention.

Other illustrative operations that may be performed in a given embodiment of the invention include, for example, the formation of redistribution layer (RDL) conductors, the formation of a passivation layer, and formation of contact metallizations.

Figure 4:
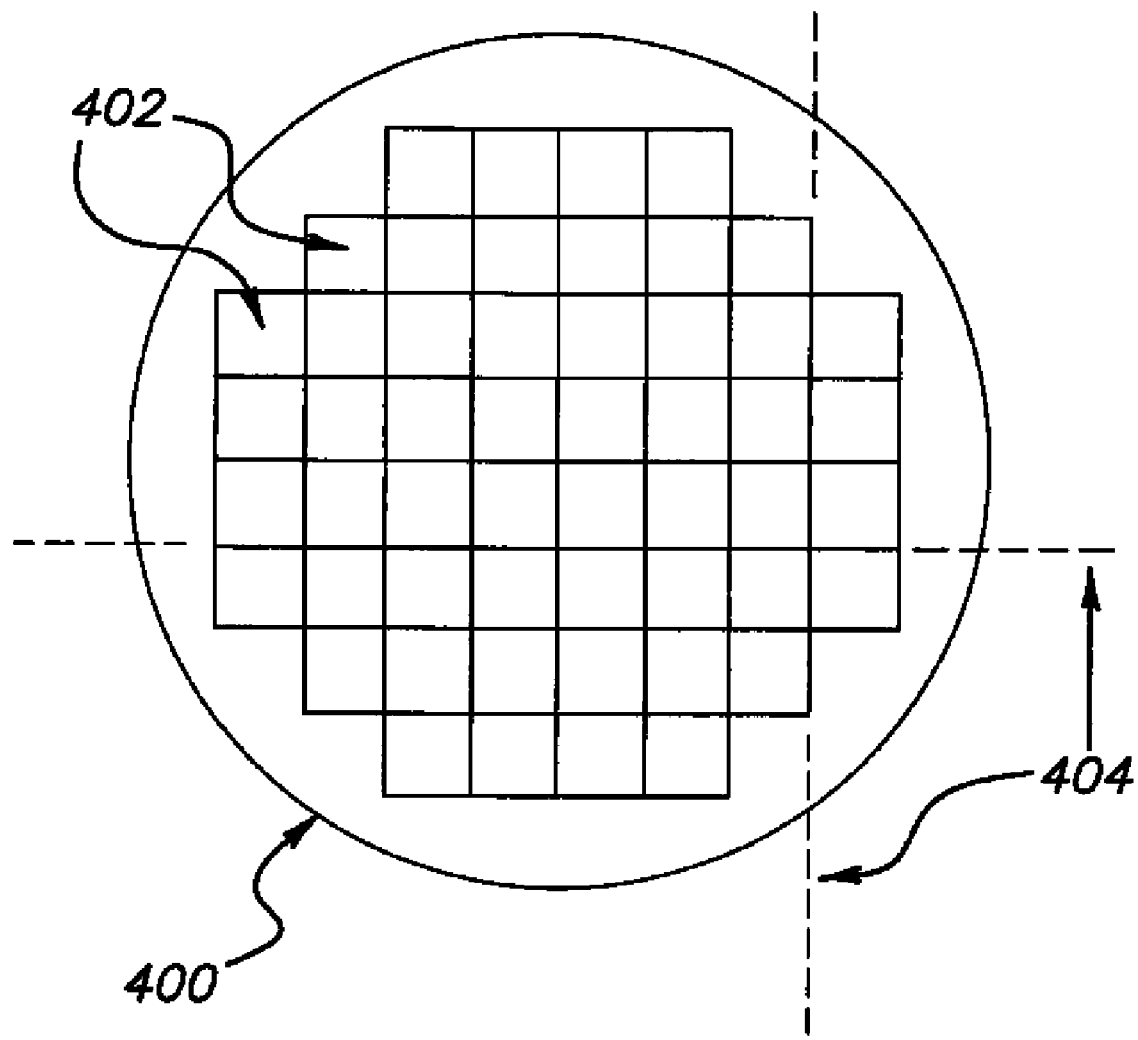
FIG. 4 is a plan view of an image sensor wafer comprising multiple image sensors formed using the exemplary process of FIG. 3.

As indicated above, the processing operations illustrated in FIG. 3 are wafer level processing operations applied to an image sensor wafer. FIG. 4 shows a plan view of an image sensor wafer 400 comprising a plurality of image sensors 402. The image sensors 402 are formed through wafer level processing of the image sensor wafer 400 as described in conjunction with FIG. 3. The image sensors are then separated from one another by dicing the wafer along dicing lines 404. A given one of the image sensors 402 corresponds to image sensor 14 in digital camera 10 of FIG. 1.

The above-described illustrative embodiments advantageously provide an improved processing arrangement for forming a backside illuminated image sensor. For example, the FIG. 3 process produces an arrangement in which the doped seed layer 310 is configured to reduce dark side current at the interface between the sensor layer 330 and the buried oxide layer 204 without shorting of peripheral wells or undue thickening of the epitaxial layer 320. This provides a backside illuminated image sensor that exhibits improved performance in terms of an enhanced ability to detect incident light.

The invention has been described in detail with particular reference to certain illustrative embodiments thereof, but it will be understood that variations and modifications can be effected within the scope of the invention as set forth in the appended claims. For example, the invention can be implemented in other types of image sensors and digital imaging devices, using alternative materials, wafers, layers, process steps, etc. Thus, various process parameters such as layer thicknesses and dopant concentrations described in conjunction with the illustrative embodiments can be varied in alternative embodiments. These and other alternative embodiments will be readily apparent to those skilled in the art.

PARTS LIST 10 digital camera
12 imaging stage
14 backside illuminated image sensor
16 processor
18 memory
20 display
22 input/output (I/O) elements
200 image sensor wafer
202 substrate
204 buried oxide (BOX) layer
204B buried oxide layer backside surface
204F buried oxide layer frontside surface
205 seed layer
205' doped seed layer
210 epitaxial layer
212 wells
300 sacrificial oxide layer
302 alignment marks
304 photoresist
305 pixel array area
310 doped seed layer
312 undoped portion of seed layer
314 doped portion of seed layer
320 epitaxial layer
330 sensor layer
340 pixel array
342 photosensitive elements
400 image sensor wafer
402 image sensors
404 dicing lines

The invention claimed is:

1. A wafer level processing method for forming a plurality of image sensors each having a pixel array configured for backside illumination, the image sensors being formed utilizing an image sensor wafer, the image sensor wafer comprising a substrate, a buried oxide layer formed over the substrate, and a seed layer formed over the buried oxide layer, the method comprising:

forming a sacrificial oxide layer over a frontside of the seed layer;

depositing a photoresist over the sacrificial oxide layer;

patterning the photoresist to expose only pixel array areas of the image sensor wafer, wherein each pixel array area defines an area where a pixel array for a respective one of the plurality of image sensors will be formed;

implanting a dopant having an n conductivity type into the frontside of the seed layer in only the exposed pixel array areas to form a doped seed layer where the implanted dopant extends to an interface between a backside of the seed layer and the buried oxide layer;

after implanting the dopant into the frontside of the seed layer in only the exposed pixel array areas, removing the photoresist and removing the sacrificial oxide layer;

after removing the sacrificial oxide layer, forming an epitaxial layer having a p conductivity type over the frontside of the doped seed layer; and after the epitaxial layer is formed, further processing the image sensor wafer to form the plurality of image sensors, wherein the further processing includes forming the pixel arrays for the plurality of image sensors.

2. The method of claim 1 further comprising forming alignment marks that extend through the sacrificial oxide layer and the seed layer to a frontside surface of the buried oxide layer.

3. The method of claim 1 wherein the n-type dopant comprises one of arsenic and phosphorus.

4. The method of claim 1 wherein the p-type dopant comprises one of boron and indium.

5. The method of claim 1 wherein implanting a dopant having an n conductivity type into the seed layer in only the exposed pixel array areas further comprises implanting the dopant having the n conductivity type through the sacrificial oxide layer and into the seed layer in only the exposed pixel array areas.

6. The method of claim 1 wherein implanting a dopant having an n conductivity type into the seed layer in only the exposed pixel array areas further comprises etching openings in the sacrificial oxide layer in respective ones of the exposed pixel array areas and implanting the dopant having the n conductivity type through the etched openings into the seed layer.

7. The method of claim 1 further comprising annealing the image sensor wafer prior to removing the sacrificial oxide layer.

8. The method of claim 1 further comprising forming photosensitive elements of the pixel arrays in the epitaxial layer.

9. The method of claim 1 further comprising removing the substrate to expose a backside surface of the buried oxide layer.

10. The method of claim 1 further comprising separating the image sensor wafer into the plurality of image sensors.

11. The method of claim 1 wherein the image sensor wafer comprises a silicon-on-insulator (SOI) wafer.

* * * * *